(12) United States Patent
Yang et al.

(10) Patent No.: US 10,707,143 B2
(45) Date of Patent: Jul. 7, 2020

(54) PLUG-IN TYPE POWER MODULE AND SUBSYSTEM THEREOF

(71) Applicant: Industrial Technology Research Institute, Hsinchu (TW)

(72) Inventors: Shu-Jung Yang, Hsinchu (TW); Yu-Lin Chao, Hsinchu (TW); Chun-Kai Liu, Hsinchu (TW); Ming Kaan Liang, Hsinchu (TW); Jiin Shing Perng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 155 days.

(21) Appl. No.: 15/606,355

(22) Filed: May 26, 2017

(65) Prior Publication Data

US 2017/0345735 A1 Nov. 30, 2017

(30) Foreign Application Priority Data

May 30, 2016 (TW) .............................. 105116799 A

(51) Int. Cl.
*H01L 23/36* (2006.01)
*H01L 23/373* (2006.01)
(Continued)

(52) U.S. Cl.
CPC .......... *H01L 23/3735* (2013.01); *H01L 23/36* (2013.01); *H01L 23/3731* (2013.01);
(Continued)

(58) Field of Classification Search
CPC .... H01L 23/36; H01L 23/3731; H01L 25/072
(Continued)

(56) References Cited

U.S. PATENT DOCUMENTS 6,359,331 B1 * 3/2002 Rinehart ............... H01L 23/642 257/691
7,808,100 B2 * 10/2010 Bayerer ................. H01L 24/06 174/261

(Continued)

FOREIGN PATENT DOCUMENTS

TW M402597 4/2011
TW M416320 U1 11/2011
(Continued)

OTHER PUBLICATIONS

Y. Zhang et al., "An Experimental Investigation of a Heat Pipe Integrated Power Module," 3rd IEEE ICIEA Conference, Jun. 3-5, 2008, pp. 820-823.
J. Howes et al., "Cooling of an IGBT Drive System with Vaporizable Dielectric Fluid (VDF)," 24th IEEE SEMI-THERM Symposium, Mar. 16-20, 2008, pp. 1-12.

Primary Examiner — David Vu
Assistant Examiner — Brandon C Fox
(74) Attorney, Agent, or Firm — Mintz Levin Cohn Ferris Glovsky and Popeo, P.C.; Peter F. Corless; Steven M. Jensen

(57) ABSTRACT

A plug-in type power module includes a power unit and a heat-transfer unit vertically disposed on the power unit and extending outwardly away from two sides of the power unit. A first ceramic layer is disposed between the power unit and the heat-transfer unit. Therefore, heat generated by the power unit can be transferred from the first ceramic layer to the heat-transfer unit to increase the speed of heat dissipation. A subsystem having the plug-in type power module is also provided.

4 Claims, 6 Drawing Sheets

(51) Int. Cl.
*H01L 25/065* (2006.01)
*H01L 23/427* (2006.01)
*H01L 25/11* (2006.01)
*H01L 25/07* (2006.01)
*H01L 23/31* (2006.01)
*H01L 23/467* (2006.01)
*H01L 23/367* (2006.01)

(52) U.S. Cl.
CPC ........ *H01L 23/3736* (2013.01); *H01L 23/427* (2013.01); *H01L 25/0655* (2013.01); *H01L 25/072* (2013.01); *H01L 25/117* (2013.01); *H01L 23/3121* (2013.01); *H01L 23/3135* (2013.01); *H01L 23/367* (2013.01); *H01L 23/3672* (2013.01); *H01L 23/467* (2013.01); *H01L 2224/04105* (2013.01); *H01L 2224/18* (2013.01); *H01L 2224/24226* (2013.01); *H01L 2224/32225* (2013.01); *H01L 2224/73267* (2013.01)

(58) Field of Classification Search
USPC ........................................ 257/691, 692, 718
See application file for complete search history.

(56) References Cited

U.S. PATENT DOCUMENTS

| | | | |
|---|---|---|---|
| 8,934,235 | B2 | 1/2015 | Rubenstein et al. |
| 9,220,184 | B2 | 12/2015 | Ranjan et al. |
| 2005/0083655 | A1 | 4/2005 | Jairazbhoy et al. |
| 2007/0285895 | A1* | 12/2007 | Gruendler ........... H01L 23/4093 361/711 |
| 2013/0256856 | A1* | 10/2013 | Mahler ............. H01L 23/49562 257/676 |
| 2014/0226284 | A1* | 8/2014 | Yamauchi ............... C23C 24/04 361/722 |
| 2016/0095256 | A1 | 3/2016 | Chen |

FOREIGN PATENT DOCUMENTS

| | | |
|---|---|---|
| TW | 201405281 A | 2/2014 |
| TW | 201613755 A | 4/2016 |
| TW | 201614783 A | 4/2016 |

\* cited by examiner

PLUG-IN TYPE POWER MODULE AND SUBSYSTEM THEREOF

TECHNICAL FIELD

The present disclosure relates to a power module, and relates to a plug-in type power module and subsystem thereof.

BACKGROUND

Small power modules such as Intelligent Power Modules (IPMs) are often used in motor driving systems in industrial manufacturing, white appliances and the electric motors in electric vehicles/hybrid electric vehicles (EV/HEV). The small power module is usually manufactured by bonding wires to a lead frame and then encapsulating these components in a mold. For heat dissipation of these small power modules, a bare copper structure such as an exposed Direct Bonded Copper (DBC) is often used for heat dissipation. However, due to the small volume, the cooling capacity is relatively limited, large cooling fins are often required for heat dissipation.

As the overall structure of the small power module is formed by mold encapsulation, only connection terminals and pins are exposed, it is difficult to align the heat sink to the power module during the assembly process.

SUMMARY

The present disclosure provides a plug-in type power module, which may include: a power unit; a heat-transfer unit vertically disposed on the power unit and extending outwardly away from two sides of the power unit; and a first ceramic layer provided between the power unit and the heat-transfer unit, wherein heat generated by the power unit is transferred from the first ceramic layer to the heat-transfer unit to increase the speed of heat dissipation.

Another embodiment of the present disclosure provides a plug-in type power module, which may include: a first power unit; a second power unit; and a heat-transfer unit including a first surface on which the first power unit is provided and a second surface on which the second power unit is provided.

The present disclosure further includes a subsystem, which may include: a substrate provided with at least one slot; and a power module inserted into the slot and including: a power unit; a heat-transfer unit vertically disposed on the power unit and extending outwardly away from two sides of the power unit; and a first ceramic layer provided between the power unit and the heat-transfer unit, wherein heat generated by the power unit is transferred from the first ceramic layer to the heat-transfer unit to increase the speed of heat dissipation.

The present disclosure further includes a plug-in type power module, which may include: a power unit; a heat-transfer unit vertically disposed on the power unit and extending outwardly away from two sides of the power unit; and a printed circuit structure provided between the power unit and the heat-transfer unit, wherein heat generated by the power unit is transferred from the printed circuit structure to the heat-transfer unit to increase the speed of heat dissipation.

The present disclosure further provides a plug-in type power module, which may include: a power unit; a heat-transfer unit vertically disposed on the power unit and extending outwardly away from two sides of the power unit; and a thick copper layer provided between the power unit and the heat-transfer unit, wherein heat generated by the power unit is transferred from the thick copper layer to the heat-transfer unit to increase the speed of heat dissipation.

DETAILED DESCRIPTION OF THE EMBODIMENTS

Figure 1:
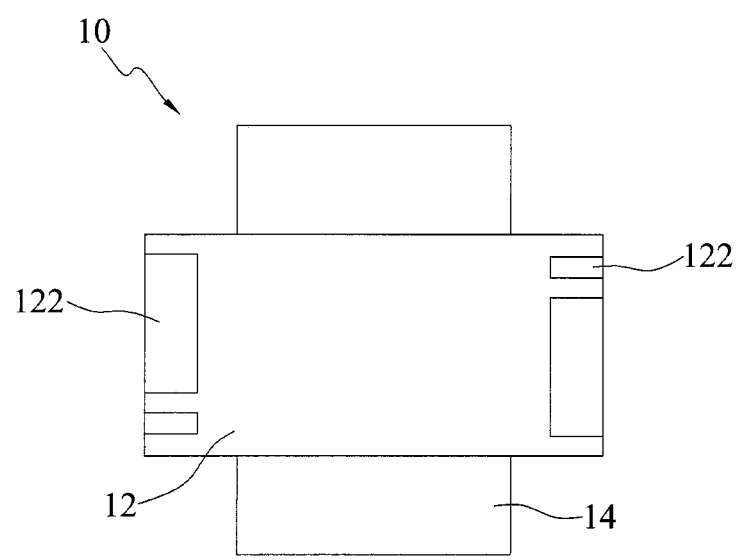
FIG. 1 is a schematic diagram depicting a plug-in type power module in accordance with the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
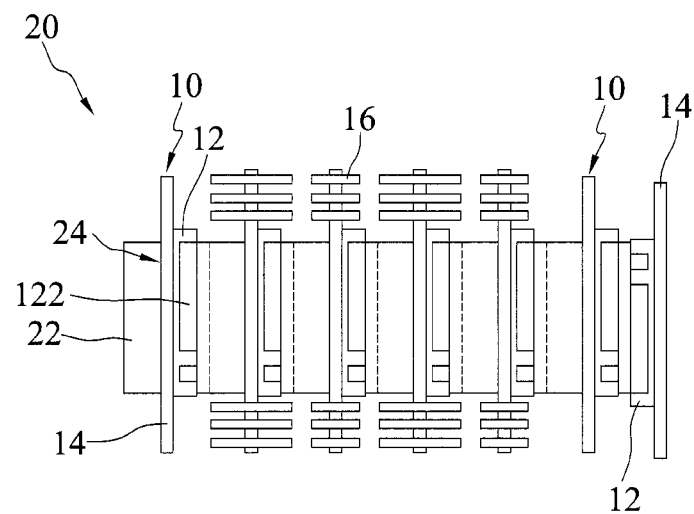
FIG. 2A is a top view of a subsystem of the present disclosure.

Referring to FIG. 1, a schematic diagram depicting a plug-in type power 10 module in accordance with the present disclosure is shown. The plug-in type power module 10 includes a power unit 12 and a heat-transfer unit 14. The heat-transfer unit 14 is vertically disposed on the power unit 12, and extends outwardly away from two sides of the power unit 12 (outside the power unit 12). A plurality of fins 16 are disposed at two sides of the heat-transfer unit 14 (as shown in FIG. 2A). A ceramic layer is disposed between the power unit 12 and the heat-transfer unit 14 (a first ceramic layer 18 shown in FIG. 3) such that heat generated by the power unit 12 can be transferred from the ceramic layer to the heat-transfer unit 14. This increases the speed of heat dissipation for the heat-transfer unit 14 having characteristics of a heat pipe. In an embodiment, the ceramic layer can be made of Alumina, aluminum nitride, silicon carbide or the like. The heat-transfer unit 14 has a hermetic casing in a low vacuum state and filled with a working fluid. A capillary structure is provided on an inner wall of the casing. The casing has a plate shape, which is the same throughout the various embodiments below. In other words, the heat-transfer unit 14 can be a heat pipe. Therefore, by extending the heat-transfer unit 14 outwardly away from two sides of the power unit 12 and providing fins 16 at two sides of the heat-transfer unit 14, the area for heat dissipation and cooling effect is increased.

The power unit 12 includes at least one first contact 122 for providing electrical connection with a substrate 22 (shown in FIG. 2A). At least one second contact 26 is provided on the substrate 22 (as shown in FIG. 2B) for providing electrical connection with the first contact 122 of the power unit 12.

Figure 2B:
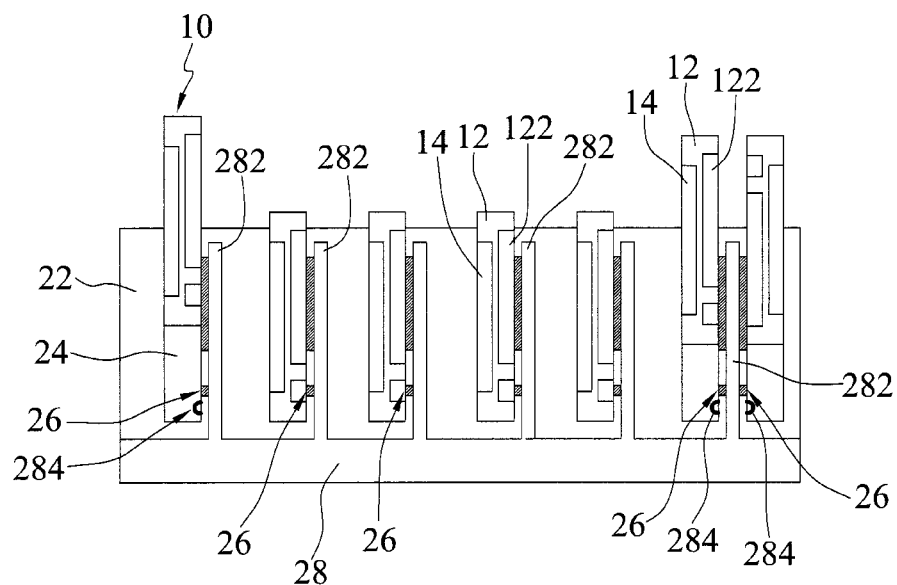
FIG. 2B is a cross-sectional view of a subsystem of the present disclosure.

Referring to FIGS. 2A and 2B, a top view and a cross-sectional view of a subsystem of the present disclosure are shown, respectively. The subsystem 20 includes the plug-in type power module 10 and the substrate 22. At least one slot 24 is provided on the substrate 22 for the plug-in type power module 10 to be inserted therein. The plug-in type power module 10 includes the power unit 12 and the heat-transfer unit 14. The heat-transfer unit 14 is vertically disposed on the power unit 12, and extends outwardly away from two sides of the power unit 12 (outside the power unit 12). The plurality of fins 16 are disposed at two sides of the heat-transfer unit 14. The first ceramic layer 18 is disposed between the power unit 12 and the heat-transfer unit 14 in order to electrically insulate the power unit 12 and the heat-transfer unit 14 while acting as a conductor. The heat-transfer unit 14 has a casing in a low vacuum state and filled with a working fluid. A capillary structure is provided on the inner wall of the casing. The heat-transfer unit 14 can be a heat pipe.

The power unit 12 includes at least one first contact 122 for providing electrical connection with the second contact 26 of the substrate 22. A first interconnect branch 282 of a first interconnect 28 is provided in the substrate 22. The first interconnect branch 282 extends into the inside of the slot 24 to enable electrical connection with the first contact 122 of the power unit 12 of the plug-in type power module 10. The second contact 26 can be formed on the first interconnect branch 282. The subsystem 20 according to the present disclosure has such a design that it facilitates quick plug-in of the plug-in type power module 10 on the substrate 22, thus improving the speed and ease of maintenance.

In an embodiment, the first interconnect branch 282 may act as an electrical connection between two plug-in type power module 10. That is, two plug-in type power module 10 are inserted at either side of the first interconnect branch 282.

In an embodiment, the first contact 122 of the power unit 12 protrudes from the surface of the power unit 12, and an elastic clip 284 is provided on the first interconnect 28 (the first interconnect branch 282). When the first contact 122 of the power unit 12 is inserted into the slot 24 of the substrate 22, as it passes through the elastic clip 284 of the first interconnect 28 (the first interconnect branch 282), it gets clipped in place by the clip. Since the elastic clip 284 is elastic, when removing the plug-in type power module 10, the first contact 122 can be easily detached from the elastic clip 284 by pulling the plug-in type power module 10 out of the slot 24.

Figure 3:
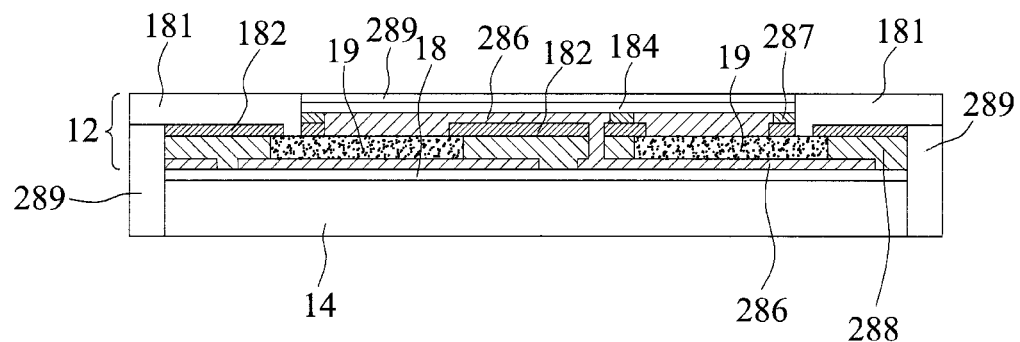
FIG. 3 is a schematic diagram depicting a more detailed structure of the plug-in type power module of the present disclosure.

Referring to FIG. 3, a schematic diagram depicting a more detailed structure of the plug-in type power module according to the present disclosure is shown. As shown in FIG. 3, it is further illustrated that the first ceramic layer 18 is disposed on the heat-transfer unit 14. The first ceramic layer 18 can be made of an electrically insulating and heat conducting material, including Alumina, aluminum nitride, silicon carbide or the like. The ceramic layers mentioned below are all made of similar materials. Portion of second interconnect 286 is provided on the first ceramic layer 18, and at least one chip 19 (or an IC chip) is provided on the portion of the second interconnect 286. The portion of the second interconnect 286 is electrically connected with the chip 19 to allow signal transmission to be performed therebetween. Then, a first molding compound 288 is provided (filled) on the first ceramic layer 18 and around the chip 19 to fix the chip 19 in place. Next, a second ceramic layer 182 and a portion of the second interconnect 286 are provided on the first ceramic layer 18, the chip 19 and the first molding compound 288. A second molding compound 287 is provided on the second ceramic layer 182 and between the portion of the second interconnect 286 to cover the second ceramic layer 182. Thereafter, a third ceramic layer 184 is provided on the portion of the second interconnect 286. Finally, holes are drilled in the second molding compound 287 and the second ceramic layer 182 to form I/O contacts 181. A third molding compound 289 is provided underneath the I/O contacts 181 and at two sides of the power unit 12 and the heat-transfer unit 14 to encapsulate and protect the power unit 12 (the chip 19 and the interconnect 286) and the heat-transfer unit 14. The first to third molding compounds 288, 287, and 289 are made of epoxy resin or the like. The third molding compound 289 can also be molded on the third ceramic layer 184.

In an embodiment, the first interconnect, the second interconnect and the interconnect mentioned herein refer to electrical connections that enable connections between upper and lower layers by vias.

In an embodiment, as shown in FIG. 3, a plurality of chips 19 are provided on the first ceramic layer 18. Each of the chips 19 is connected to at least one I/O contact 181. The second interconnect 286 is connected to the bottom of a chip 19 and the top of another chip 19. The second ceramic layer 182 provides the I/O contacts 181 on its surface for connecting with the chips 19. The surface of the first ceramic layer 18 is attached to the heat-transfer unit 14, such as a heat pipe. In order to protect the heat-transfer unit 14 and the power unit 12, the third molding compound 289 can be provided at two sides of the heat-transfer unit 14 and the power unit 12. Therefore, the heat-transfer unit 14 according to the present disclosure extends outwardly away from two sides of the power unit 12, such that heat from the chips 19 of the power unit 12 can be transferred to the heat-transfer unit 14 via the first ceramic layer 18. The fins 16 at two sides of the heat-transfer unit 14 increase the area and thus the speed of heat dissipation.

Figure 4:
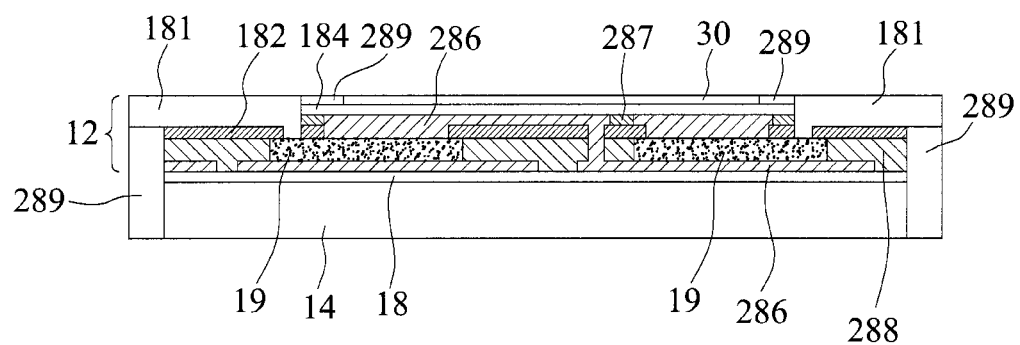
FIG. 4 is a schematic diagram illustrating a plug-in type power module in accordance with a first embodiment of the present disclosure.

Referring to FIG. 4, a schematic diagram illustrating a plug-in type power module in accordance with a first embodiment of the present disclosure is shown. This embodiment is similar to that shown in FIG. 3, the difference includes that: a metal thermal conducting plate (sheet) 30 is provided on the third ceramic layer 184 within an inner region where the I/O contacts 181 are connected to the chip 19, wherein the metal thermal conducting plate 30 is not in contact with the I/O contacts 181. Therefore, the plug-in type power module 10 with the addition of the metal thermal conducting plate (sheet) 30 forms a double sided heat dissipation structure, improving the cool speed. A portion of the third ceramic layer 184 not covered by the metal thermal conducting plate 30 is encapsulated by the third molding compound 289.

Figure 5:
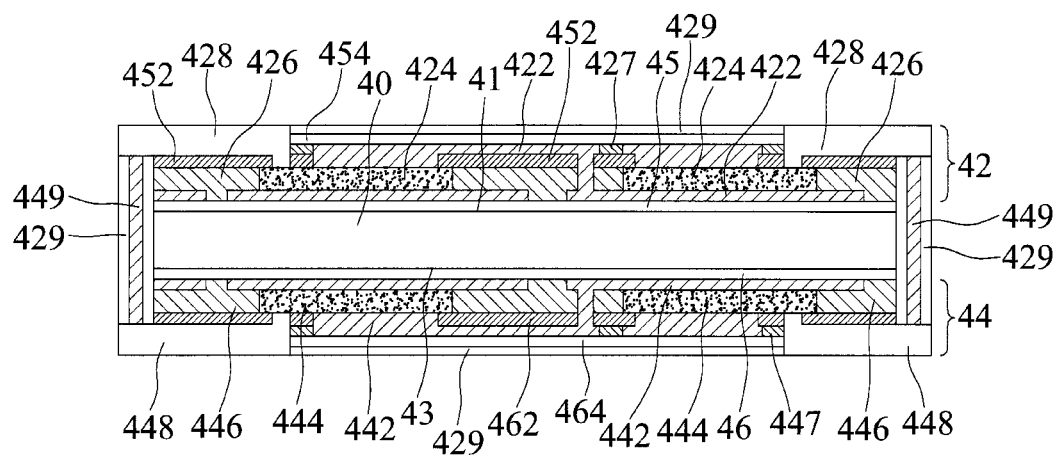
FIG. 5 is a schematic diagram illustrating a plug-in type power module in accordance with a second embodiment of the present disclosure.

Referring to FIG. 5, a schematic diagram illustrating a plug-in type power module in accordance with a second embodiment of the present disclosure is shown. The second embodiment includes a sandwich structure, in which a first power unit 42 and a second power unit 44 are provided at two sides of a heat-transfer unit 40, respectively. The heat-transfer unit 40 includes a first surface 41 and a second surface 43. The first power unit 42 is provided on the first surface 41, and the second power unit 44 is provided on the second surface 43. A fourth ceramic layer 45 is provided on the first surface 41 of the heat-transfer unit 40. The fourth ceramic layer 45 can be made of an electrical insulating and thermal conducting material, including Alumina, aluminum nitride, silicon carbide or the like. The ceramic layers mentioned below are all made of similar materials. A portion of a fourth interconnect 422 is provided on the fourth ceramic layer 45, and at least one chip 424 (or IC chip) is provided on the portion of the fourth interconnect 422. The portion of fourth interconnect 422 is electrically connected with the chips 424 to allow signal transmission to be performed therebetween. Then, a fourth molding compound 426 is provided (or filled) on the fourth ceramic layer 45 and around the chips 424 to fix the chips 424 in place. Next, a fifth ceramic layer 452 and a portion of the fourth interconnect 422 are provided on the fourth ceramic layer 45, the chips 424 and the fourth molding compound 426. A fifth molding compound 427 is provided on the fifth ceramic layer 452 and between the portion of the fourth interconnect 422 to cover the fifth ceramic layer 452. Thereafter, a sixth ceramic layer 454 is provided on the portion of the fourth interconnect 422. Finally, holes are drilled in the fifth molding compound 427 and the fifth ceramic layer 452 to form I/O contacts 428.

A seventh ceramic layer 46 is provided on the second surface 43 of the heat-transfer unit 40. The seventh ceramic layer 46 can be made of an electrical insulating and thermal conducting material, including Alumina, aluminum nitride, silicon carbide or the like. The ceramic layers mentioned below are all made of similar materials. A portion of a fifth interconnect 442 is provided on the seventh ceramic layer 46, and at least one chip 444 (or IC chip) is provided on the portion of the fifth interconnect 442. The portion of fifth interconnect 442 is electrically connected with the chips 444 to allow signal transmission. Then, a seventh molding compound 446 is provided (or filled) on the seventh ceramic layer 46 and around the chips 444 to fix the chips 444 in place. Next, an eighth ceramic layer 462 and a portion of the fifth interconnect 442 are provided on the seventh ceramic layer 46, the chips 444 and the seventh molding compound 446. An eighth molding compound 447 is provided on the eighth ceramic layer 462 and between the portion of the fifth interconnect 442 to cover the eighth ceramic layer 462. Thereafter, a ninth ceramic layer 464 is provided on the portion of the fifth interconnect 442. Finally, holes are drilled in the eighth molding compound 447 and the eighth ceramic layer 462 to form I/O contacts 448. A ninth molding compound 429 is provided underneath the I/O contacts 428 of the first power unit 42 and at two sides of the first power unit 42 and the heat-transfer unit 40 and underneath the I/O contacts 448 of the second power unit 44 and at two sides of the second power unit 44 and the heat-transfer unit 40 to encapsulate and protect the first power unit 42 and the second power unit 44 (as well as the chips 424 and 444 and the interconnects 422 and 442) and the heat-transfer unit 40. The seventh to ninth molding compounds 446, 447 and 429 are made of epoxy resin or the like. Thus, the exposed I/O contacts according to the present disclosure allow electrical connection with the subsystem by plugging into the elastic clips inside the slot of the substrate. In addition, the ninth molding compound 429 can also be molded on the sixth ceramic layer 454 and the ninth ceramic layer 464.

In an embodiment, before the I/O contacts 428 and 448 of the first power unit 42 and the second power unit 44 are disposed, holes can be drilled in the ninth ceramic layer 464 and filled with metals to form vias 449 for electrical connection between the I/O contacts 428 and 448 of the first power unit 42 and the second power unit 44.

In an embodiment, metal thermal conducting plates (sheet) (not shown) are disposed on the sixth ceramic layer 454 and the ninth ceramic layer 464 as shown in FIG. 4 between the I/O contacts 428 and 448 of the first power unit 42 and the second power unit 44, but are not in contact with the I/O contacts 428 and 448. Therefore, the power module forms a double-sided heat dissipation structure with the addition of the metal thermal conducting plate, thereby improving the cool speed.

Figure 6:
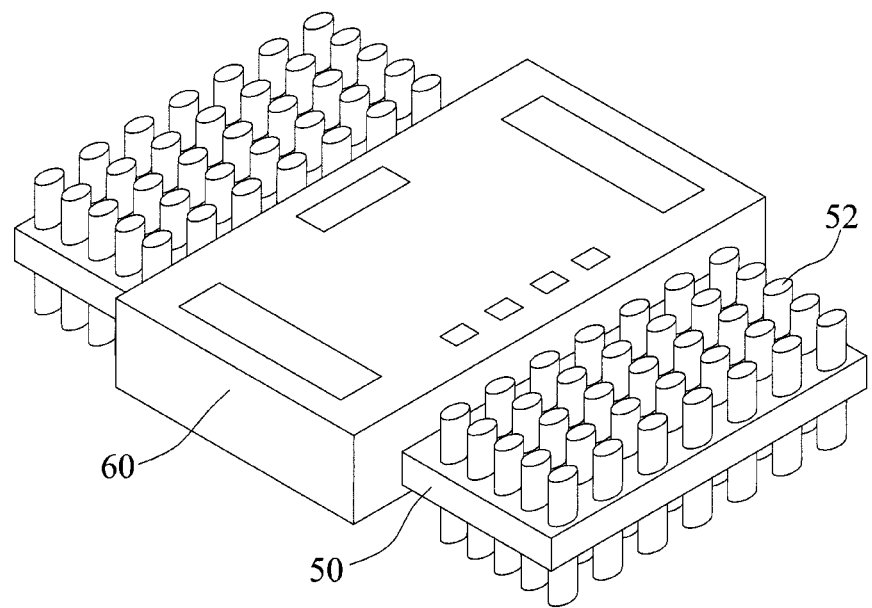
FIG. 6 is an isometric view of the plug-in type power module of the present disclosure.

Referring to FIG. 6, an isometric view of the plug-in type power module according to the present disclosure is shown. A heat-transfer unit 50 can be a heat pipe with a plurality of columnar fins 52. The power unit 60 is attached on the heat-transfer unit 50 and within an area where no columnar fins 52 exist. The present disclosure increases heat dissipating area and improves heat dissipation by providing the heat-transfer unit 50 at two sides of the power unit 60 and columnar fins 52 at two ends of the heat-transfer unit 50.

Figure 7:
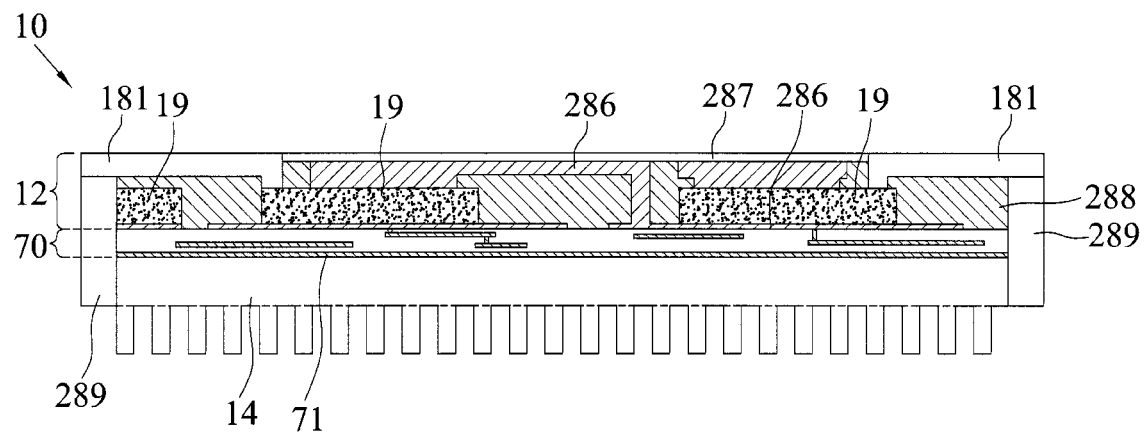
FIG. 7 is a schematic diagram illustrating a plug-in type power module in accordance with a third embodiment of the present disclosure.

Referring to FIG. 7, a schematic diagram depicting a plug-in type power module in accordance with a third embodiment of the present disclosure is shown. The third embodiment is different from the previous embodiment in that the ceramic layers are replaced by a printed circuit structure 70. Below only the differences between the two embodiments are described, while descriptions of similar technical contents are omitted.

The plug-in type power module 10 includes a power unit 12 and a heat-transfer unit 14. The heat-transfer unit 14 is substantially vertically attached to the power unit 12, and extends outwardly away from two sides of the power unit 12 (outer sides of the power unit 12). A plurality of fins 16 are provided at two ends of the heat-transfer unit 14 (as shown in FIG. 2A). A printed circuit structure 70 is disposed between the power unit 12 and the heat-transfer unit 14. As heat generated by the power unit 12 is transferred to the heat-transfer unit 14 via the printed circuit structure 70, the heat-transfer unit 14 with the characteristics of a heat pipe is able to improve the speed of heat dissipation. In an embodiment, the printed circuit structure 70 includes a ground copper layer 71, and is in contact with the heat-transfer unit 14 through solder bonding. That is, the printed circuit structure 70 is bonded onto the heat-transfer unit 14 via the ground copper layer 71.

In an embodiment, the heat-transfer unit 14 is a heat pipe or a copper floor.

In another embodiment, the printed circuit structure 70 is formed with an insulating material and a metal material, and performs heat-transfer through the metal layers.

A portion of a second interconnect 286 is provided on the printed circuit structure 70, and at least one chip 19 (or an IC chip) is provided on the portion of the second interconnect 286. The portion of the second interconnect 286 is electrically connected with the chips 19 to allow signal transmission to be performed therebetween. Then, a first molding compound 288 is provided (filled) on the printed circuit structure 70 and around the chips 19 to fix the chips 19 in place. Next, a portion of the second interconnect 286 and I/O contacts 181 are provided on the printed circuit structure 70, the chips 19 and the first molding compound 288. Then, a second molding compound 287 is provided on the portion of the second interconnect 286 and the first molding compound 288 and between the I/O contacts 181. A third molding compound 289 is provided underneath the I/O contacts 181 and at two sides of the power unit 12 and the heat-transfer unit 14 to encapsulate and protect the power unit 12 (the chips 19 and the interconnect 286) and the heat-transfer unit 14. The first to third molding compounds 288, 287, and 289 are made of epoxy resin or the like.

In an embodiment, the plurality of chips 19 are provided on the printed circuit structure 70, each of the chips 19 is connected with an I/O contact 181, and the second interconnect 286 is connected with the bottom of one chip 19 and the top of another chip 19.

Figure 8:
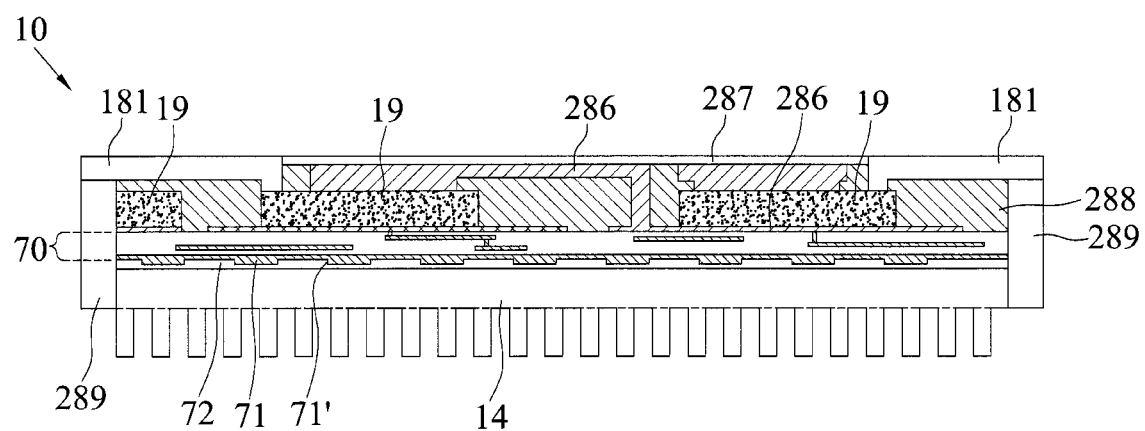
FIG. 8 is a schematic diagram illustrating a plug-in type power module in accordance with a fourth embodiment of the present disclosure.

Referring to FIG. 8, a schematic diagram depicting a plug-in type power module in accordance with a fourth embodiment of the present disclosure is shown. The fourth embodiment is different from the third embodiment in that a plurality of grooves 71' are formed on the ground copper layer 71. In the following, only the differences between the two embodiments are described, while descriptions of similar technical contents are omitted.

A plurality of grooves 71' are formed on the surface of the ground copper layer 71 of the printed circuit structure 70 by a process such as etching or lamination. The plurality of grooves 71' are filled with glue 72 (e.g., epoxy resin), such that when the printed circuit structure 70 is laminated onto the heat-transfer unit 14, the surface of a portion of the ground copper layer 71 is in direct contact with the heat-transfer unit 14, and the ground copper layer 71 is bonded with the heat-transfer unit 14 through the glue 72 in the plurality of grooves 71' to effectively increase bonding strength.

In an embodiment, the heat-transfer unit 14 can be a heat pipe.

Figure 9:
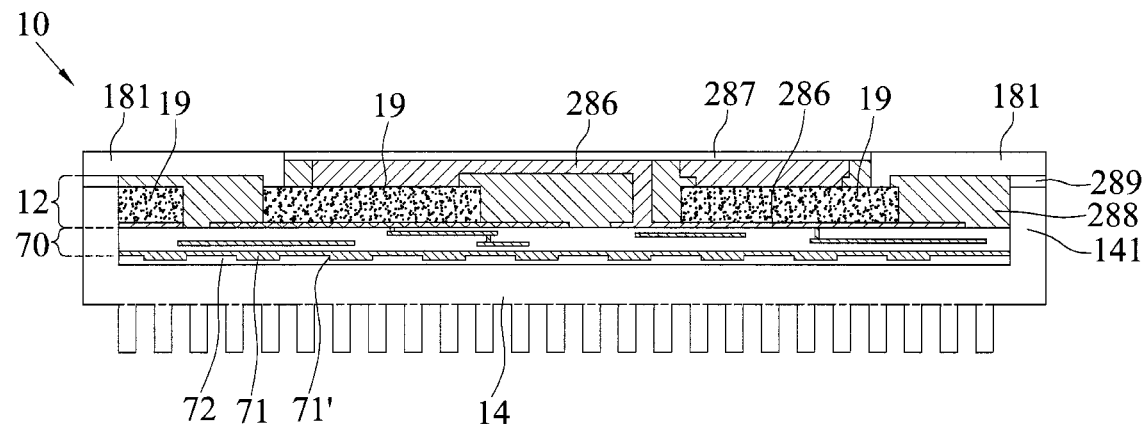
FIG. 9 is a schematic diagram illustrating a plug-in type power module in accordance with a fifth embodiment of the present disclosure.

Referring to FIG. 9, a schematic diagram depicting a plug-in type power module in accordance with a fifth embodiment of the present disclosure is shown. The fifth embodiment is different from the fourth embodiment in that the heat-transfer unit 14 can be a copper floor. In the following, only the differences between the two embodiments are described, while descriptions of similar technical contents are omitted.

In an embodiment where the heat-transfer unit 14 is a copper floor, a frame 141 surrounds the heat-transfer unit 14 to form an inner space for receiving the power unit 12 and the printed circuit structure 70. The frame 141 protects the printed circuit structure 70. Therefore, in an embodiment, a less amount of the third molding compound 289 is needed between the frame 141 and the I/O contacts 181, as compared with the third embodiment where the third molding compound 289 is needed underneath the I/O contacts 181 and at two sides of the power unit 12 and the heat-transfer unit 14.

In an embodiment, in addition to being provided on the printed circuit structure 70 and around the chips 19, the first molding compound 288 can also be formed above the chips 19 and the second interconnect 286 in order to completely cover the chips 19 and the second interconnect 286. Then, the second molding compound 287 is formed on the first molding compound 288 covering the chips 19 and the second interconnect 286 and between the I/O contacts 181.

Figure 10:
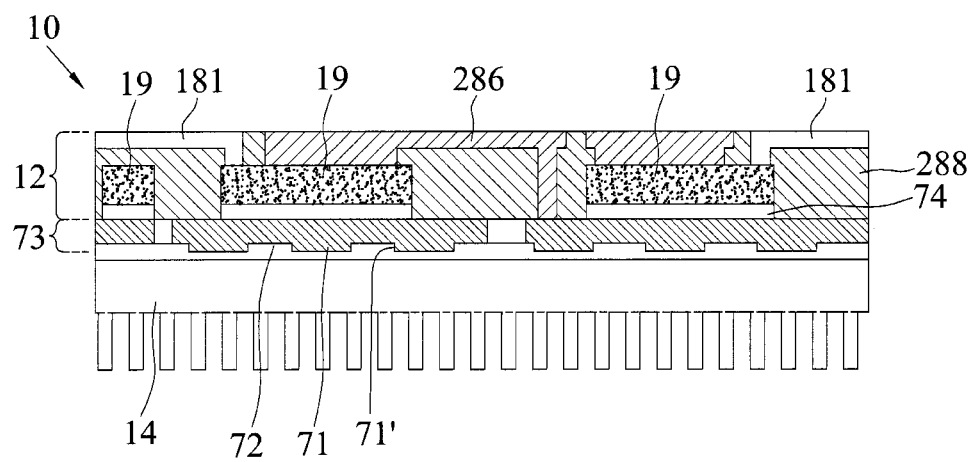
FIG. 10 is a schematic diagram illustrating a plug-in type power module in accordance with a sixth embodiment of the present disclosure.

Referring to FIG. 10, a schematic diagram depicting a plug-in type power module in accordance with a sixth embodiment of the present disclosure is shown. Descriptions of similar technical contents in this embodiment and the previous embodiment are omitted to avoid repetition.

The plug-in type power module 10 includes a power unit 12 and a heat-transfer unit 14. The heat-transfer unit 14 is substantially vertically attached to the power unit 12, and extends outwardly away from two sides of the power unit 12 (outer sides of the power unit 12). A plurality of fins 16 are provided at two ends of the heat-transfer unit 14 (as shown in FIG. 2A). A thick copper layer 73 is disposed between the power unit 12 and the heat-transfer unit 14. As heat generated by the power unit 12 can be transferred to the heat-transfer unit 14 via the thick copper layer 73, the heat-transfer unit 14 with the characteristics of a heat pipe is able to improve the speed of heat dissipation.

In an embodiment, the thick copper layer 73 is bonded to the heat-transfer unit 14 via glue 72 such as thermal conductor glue.

In another embodiment, a plurality of grooves 71' are formed on the surface of the thick copper layer 73 that is bonded to the heat-transfer unit 14. The plurality of grooves 71' are filled with the glue 72, such that when the thick copper layer 73 is laminated onto the heat-transfer unit 14, the surface of a portion of the thick copper layer 73 can be in direct contact with the heat-transfer unit 14, and the thick copper layer 73 is bonded with the heat-transfer unit 14 through the glue 72 in the plurality of grooves 71' to effectively increase bonding strength, reduce stress and electrical discharge.

In an embodiment, the heat-transfer unit 14 can be a heat pipe or a copper floor.

A second interconnect 286 is provided on the thick copper layer 73, and at least one chip 19 (or an IC chip) is provided on the thick copper layer 73. In an embodiment, the chips 19 are provided on the thick copper layer 73 through a solder material 74. The second interconnect 286 is electrically connected with the chips 19 to allow signal transmission to be performed therebetween. Then, a first molding compound 288 is provided (filled) on the thick copper layer 73 and around the chips 19 to fix the chips 19 in place. Next, a portion of the second interconnect 286 and I/O contacts 181 are provided on the printed circuit structure 70, the chips 19 and the first molding compound 288. The first molding compound 288 is made of epoxy resin or the like.

In conclusion, the plug-in type power module and the subsystem according to the present disclosure increase a heat dissipating area and the effectiveness of heat dissipation by providing a heat-transfer unit extending from two sides of a power unit and providing fins at two ends of the heat-transfer unit. The speed and ease of maintenance are improved by providing an easy pluggable design on a substrate in which the power unit can be easily replaced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A plug-in type power module, comprising:
   a power unit; and
   a heat-transfer unit vertically disposed on the power unit and extending outwardly away from two sides of the power unit, and a first ceramic layer provided between the power unit and the heat-transfer unit and configured for transferring heat generated by the power unit to the heat-transfer unit to increase the speed of heat dissipation, wherein the power unit further includes:
a portion of a second interconnect provided on the first ceramic layer, at least one chip provided on the portion of the second interconnect and electrically connected with the second interconnect to allow signal transmission to be performed therebetween;
a first molding compound provided on the first ceramic layer and around the chip to fix the chip in place, and a second ceramic layer and a portion of a second interconnect provided on the first ceramic layer, the chip and the first molding compound;
a second molding compound provided on the second ceramic layer and between the portion of the second interconnect and covering the second ceramic layer;
a third ceramic layer provided on the portion of the second interconnect, and the second molding compound and the second ceramic layer being drilled and I/O contacts being fabricated; and
a third molding compound provided underneath the I/O contacts and at two sides of the power unit and the heat-transfer unit to protect the power unit and the heat-transfer unit.

2. The plug-in type power module of claim 1, wherein the first molding compound, the second molding compound and the third molding compound are made of epoxy resin.

3. The plug-in type power module of claim 1, wherein a plurality of chips are provided on the first ceramic layer, each of the chips is connected to an I/O contact, the second interconnect is connected to the bottom of a chip and the top of another chip, the second ceramic layer provides I/O contacts on a surface thereof for the chips to be connected with, and a surface of the first ceramic layer is attached to the heat-transfer unit.

4. The plug-in type power module of claim 1, further comprising a metal thermal conducting plate provided on the third ceramic layer within an inner region where the I/O contacts are connected with the chips, wherein the metal thermal conducting plate is not in contact with the I/O contacts.

* * * * *